(12) United States Patent
Hirabayashi

(10) Patent No.: US 7,126,852 B2
(45) Date of Patent: Oct. 24, 2006

(54) SEMICONDUCTOR MEMORY DEVICE HAVING AN ERROR CORRECTING CODE CIRCUIT

(75) Inventor: Osamu Hirabayashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 34 days.

(21) Appl. No.: 11/076,875

(22) Filed: Mar. 11, 2005

(65) Prior Publication Data

US 2006/0146586 A1 Jul. 6, 2006

(30) Foreign Application Priority Data

Jan. 5, 2005 (JP) ............................. 2005-000788

(51) Int. Cl.
 *G11C 16/06* (2006.01)
(52) U.S. Cl. ............... 365/185.09; 365/63; 365/189.04
(58) Field of Classification Search ........... 365/185.09, 365/63, 189.04
See application file for complete search history.

(56) References Cited

U.S. PATENT DOCUMENTS

| | | | |
|---|---|---|---|
| 5,097,441 A | | 3/1992 | Cho et al. |
| 5,400,275 A | * | 3/1995 | Abe et al. .................... 365/145 |
| 5,463,582 A | * | 10/1995 | Kobayashi et al. .... 365/189.05 |
| 5,497,349 A | * | 3/1996 | Nakai et al. ........... 365/189.04 |
| 6,091,656 A | * | 7/2000 | Ooishi ........................ 365/226 |
| 2002/0054514 A1 | * | 5/2002 | Kajigaya et al. ....... 365/189.02 |

OTHER PUBLICATIONS

C.L. Chen, et al., "Error-Correcting Codes for Semiconductor Memory Applications: A State-of-the-Art Review", IBM J. Res. Develop., vol. 28, No. 2, Mar. 1984, pp. 124-134.

* cited by examiner

*Primary Examiner*—Tuan T. Nguyen
(74) *Attorney, Agent, or Firm*—Oblon, Spivak, McClelland, Maier & Neustadt, P.C.

(57) ABSTRACT

A semiconductor memory device include includes a memory cell array which includes a first group of rows and a second group of rows, each row of the first group consisting of a plurality of first memory cells whose layout direction is a first direction, and each row of the second group consisting of a plurality of second memory cells whose layout direction is different from the first direction, a plurality of word lines which select rows of the memory cell array and each of which is connected to the first memory cells and second memory cells, and a plurality of bit line pairs which select columns of the memory cell array.

19 Claims, 6 Drawing Sheets

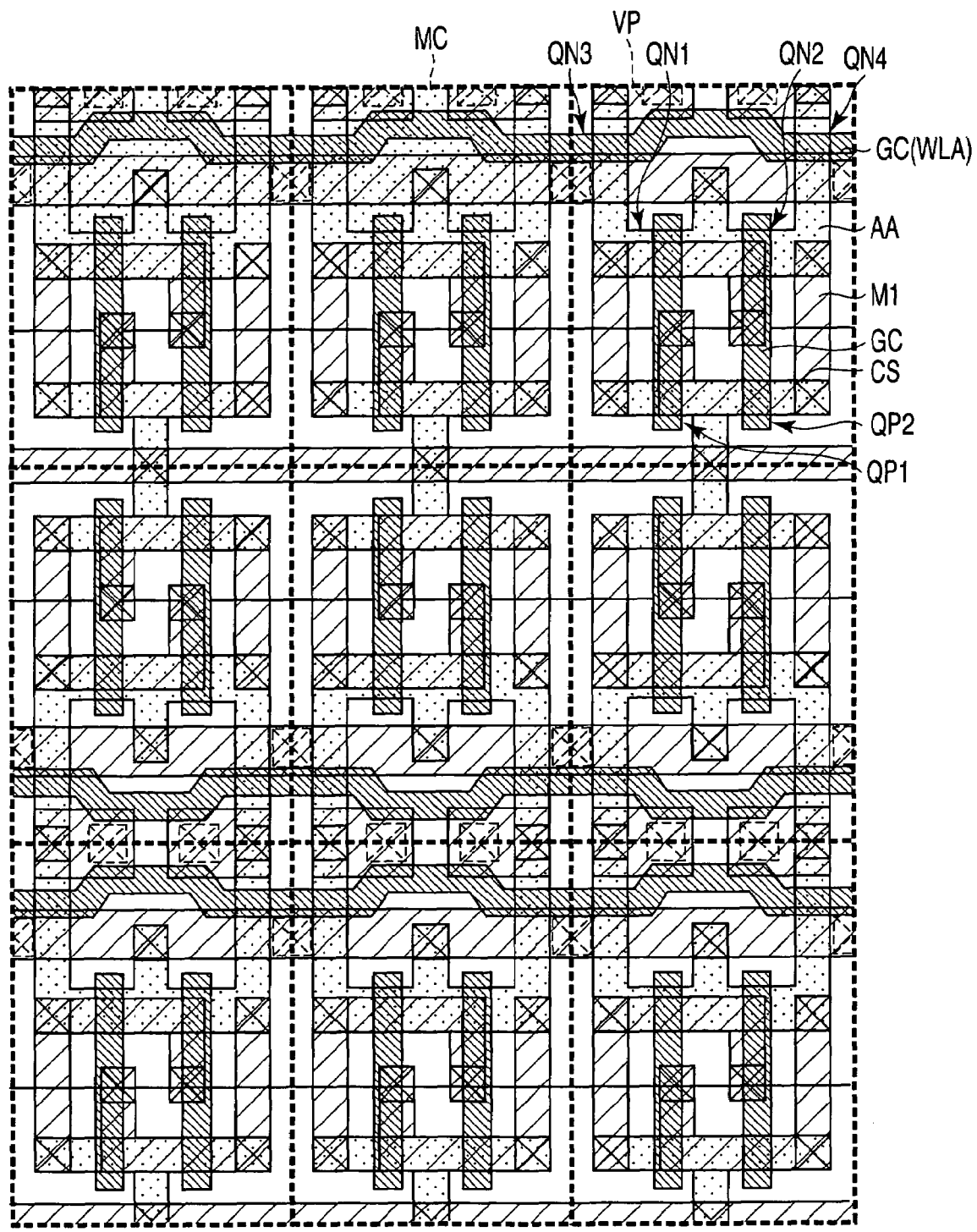
F I G. 4

SEMICONDUCTOR MEMORY DEVICE HAVING AN ERROR CORRECTING CODE CIRCUIT

CROSS-REFERENCE TO RELATED APPLICATIONS

This application is based upon and claims the benefit of priority from prior Japanese Patent Application No. 2005-000788, filed Jan. 5, 2005, the entire contents of which are incorporated herein by reference.

BACKGROUND OF THE INVENTION

1. Field of the Invention

The present invention relates to a semiconductor memory device and, more particularly, to a semiconductor memory device having an error correcting code (ECC) circuit.

2. Description of the Related Art

With the advance in micropatterning technique and the decrease in operating voltage of semiconductor memory devices, soft errors in, e.g., static random access memories (SRAMs) have come to pose a problem. The known soft errors are classified into those caused by $\alpha$-rays emitted from a radioactive substance contained in the materials such as solder used for the semiconductor devices and those caused by fast neutrons arriving as cosmic rays.

An effective measure against soft errors is to mount an ECC circuit in a semiconductor memory device. The ECC circuit can effectively relieve not only the soft errors but also hard errors which occur due to physical failures. The ECC circuit often employs, e.g., a single error correction—double error detection (SEC-DED) system capable of correcting a 1-bit error and detecting a 2-bit error.

In the semiconductor memory device, a memory cell corresponding to a designated address is selected by a row selection circuit and column selection circuit. N-bit data (word) read out from simultaneously selected memory cells is input to the ECC circuit, error-corrected, and output from the semiconductor memory device. The SEC-DED scheme can correct a 1-bit error in the N-bit data. However, an error of 2 or more bits cannot be corrected.

The physical positions of memory cells which store the data of word (N bits) to be simultaneously read out are determined by the arrangements of the row selection circuit and column selection circuit. Normally, the memory cells are regularly arrayed.

As the elements are micropatterned by scaling, and the voltage is decreased, the number of margin-based hard errors caused by the parasitic effect or element variation in the chip is increasing in addition to those which are caused by random reasons such as a crystal defect and dust. The rate of such margin-based hard errors is not uniform and changes depending on the memory cell position.

For this reason, if the fraction defective of memory cells arranged at the edge of the memory cell array is higher than that for memory cells arranged at other positions, the memory cells with the high fraction defective are simultaneously read-accessed. Hence, the rate of errors of 2 or more bits is considerably higher in this word than in other words. As a result, the relief rate by ECC in the whole memory becomes low.

As a related technique of this kind, a technique of reducing the coupling capacitance between word lines is disclosed (U.S. Pat. No. 5,097,441).

BRIEF SUMMARY OF THE INVENTION

A semiconductor memory device according to a first aspect of the present invention comprises a memory cell array which includes a first group of rows and a second group of rows, each row of the first group consisting of a plurality of first memory cells whose layout direction is a first direction, and each row of the second group consisting of a plurality of second memory cells whose layout direction is different from the first direction, a plurality of word lines which select rows of the memory cell array and each of which is connected to the first memory cells and second memory cells, and a plurality of bit lines pairs which select columns of the memory cell array.

A semiconductor memory device according to a second aspect of the present invention comprises a first memory cell array and a second memory cell array each of which has a plurality of memory cells arranged in a matrix, a plurality of first word lines each of which selects a row of the first memory cell array, a first row selection circuit which activates a corresponding one of the first word lines on the basis of a row address signal, a plurality of second word lines each of which selects a row of the second memory cell array, a second row selection circuit which activates a corresponding one of the second word lines on the basis of the row address signal, a plurality of first bit line pairs each of which selects a column of the first memory cell array, a plurality of second bit line pairs each of which selects a column of the second memory cell array, a first sense amplifier circuit which amplifiers data transferred to the plurality of first bit line pairs, and a second sense amplifier circuit which amplifies data transferred to the plurality of second bit lines pairs, wherein a distance between the second sense amplifier circuit and a second word line activated by the second row selection circuit is different from a distance between the first sense amplifier circuit and first word line activated by the first row selection circuit.

A semiconductor memory device according to a third aspect of the present invention comprises a first memory cell array and a second memory cell array each of which has a plurality of memory cells arranged in a matrix, a plurality of first word lines each of which selects a row of the first memory cell array, a plurality of second word lines each of which selects a row of the second memory cell array, a plurality of first bit line pairs each of which selects a column of the first memory cell array, a first column selection circuit which selects a corresponding one of the first bit lines pairs on the basis of a column address signal, a plurality of second bit line pairs each of which selects a column of the second memory cell array, and a second column selection circuit which selects a corresponding one of the second bit line pairs on the basis of the column address signal, wherein when a column at an end of the first memory cell array is selected by the first column selection circuit, the second column selection circuit selects a column different from a column at an end of the second memory cell array.

BRIEF DESCRIPTION OF THE SEVERAL VIEWS OF THE DRAWING

FIG. 4 is a view showing the arrangement of nine memory cells MC included in the memory cell array 11A shown in FIG. 2;

DETAILED DESCRIPTION OF THE INVENTION

Figure 1:
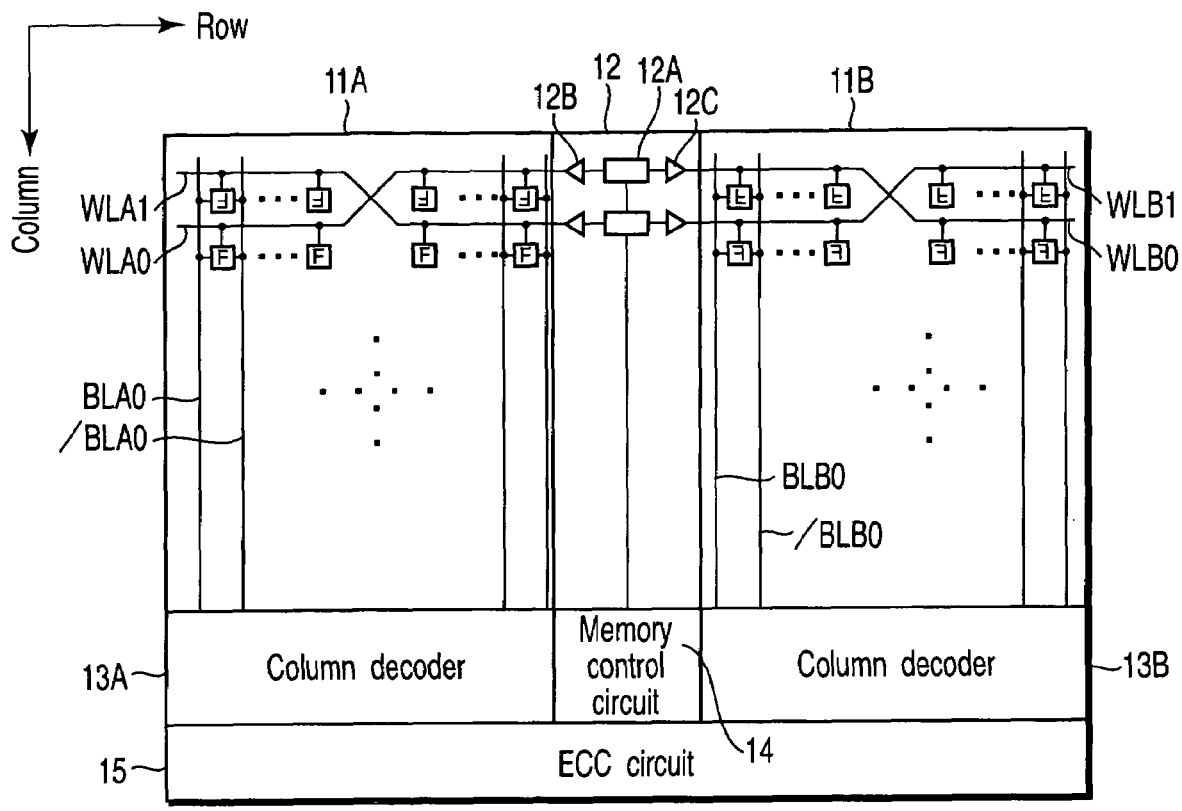
FIG. 1 is a block diagram showing the arrangement of a semiconductor memory device according to the first embodiment of the present invention.

The embodiments of the present invention will be described below with reference to the accompanying drawing. In the following description, the same reference numerals denote elements having the same functions and arrangements, and a repetitive description thereof will be done only when necessary.

(First Embodiment)

FIG. 1 is a block diagram showing the arrangement of a semiconductor memory device according to the first embodiment of the present invention. The semiconductor memory device comprises, e.g., two memory cell arrays 11A and 11B. A plurality of word lines WLA0 to WLAn running in the row direction are arranged in the memory cell array 11A. Additionally, a plurality of bit line pairs BLA0 to BLAm and /BLA0 to /BLAm running in the column direction are arranged in the memory cell array 11A.

A plurality of word lines WLB0 to WLBn running in the row direction are arranged in the memory cell array 11B. Additionally, a plurality of bit line pairs BLB0 to BLBm and /BLB0 to /BLBm running in the column direction are arranged in the memory cell array 11B.

A row decoder (row selection circuit) 12 is arranged between the memory cell array 11A and the memory cell array 11B. The row decoder 12 is connected to word lines WLA and WLB and selects the rows of the memory cell arrays 11A and 11B.

The row decoder 12 comprises a plurality of decode circuits 12A and a plurality of output circuits 12B and 12C in correspondence with the plurality of word lines. The decode circuit 12A is connected to the output circuits 12B and 12C. The output circuit 12B is connected to the word line WLA. The output circuit 12C is connected to the word line WLB. The decode circuit 12A activates the word lines WLA and WLB on the basis of a row address signal.

The row decoder 12 selects the rows of the memory cell arrays 11A and 11B simultaneously. That is, the row decoder 12 activates the word lines WLA and WLB simultaneously on the basis of the row address signal.

More specifically, the row decoder 12 sequentially activates the word lines WLA0 to WLAn in accordance with the progress order of the row address signal. Simultaneously, the row decoder 12 sequentially activates the word lines WLB0 to WLBn in accordance with the progress order of the row address signal.

In this embodiment, one row decoder 12 is arranged in correspondence with the memory cell arrays 11A and 11B. However, the present invention is not limited to this. A row decoder may be arranged for each of the memory cell arrays 11A and 11B.

A column decoder (column selection circuit) 13B is arranged at the column-direction end of the memory cell array 11A. The column decoder 13A is connected to a plurality of bit lines pairs BLA and /BLA. The column decoder 13A selects a column of the memory cell array 11A on the basis of a column address signal.

A column decoder (column selection circuit) 13B is arranged at the column-direction end of the memory cell array 11B. The column decoder 13B is connected to a plurality of bit line pairs BLB and /BLB. The column decoder 13B selects a column of the memory cell array 11B on the basis of a column address signal.

The column decoders 13A and 13B select the columns of the memory cell arrays 11A and 11B simultaneously. That is, the column decoders 13A and 13B select the bit line pair BLA and /BLA and the bit line pair BLB and /BLB simultaneously on the basis of the column address signals.

More specifically, the column decoder 13A sequentially selects the bit line pairs BLA0 to BLAm and /BLA0 to /BLAm in accordance with the progress order of the column address signal. Simultaneously, the column decoder 13B sequentially selects the bit line pairs BLB0 to BLBm and /BLB0 to /BLBm in accordance with the process order of the column address signal.

Data read out from memory cells MC through the column decoders 13A and 13B are detected and amplified by a sense amplifier circuit (not shown) and output from an input/output circuit (not shown).

The semiconductor memory device comprises a memory control circuit 14. The memory control circuit 14 controls the row decoder 12 and column decoders 13A and 13B. That is, the memory control circuit 14 executes control related to data input/output.

The semiconductor memory device comprises an ECC circuit 15. The ECC circuit 15 executes error correction by, e.g., an SEC-DED scheme. More specifically, the ECC circuit 15 generates an ECC code for input data and stores the ECC code. The ECC circuit 15 executes error correction on the basis of an ECC code corresponding to output data.

When a 1-bit error is present in the output data, the ECC circuit 15 corrects the error. When an error of 2 or more bits is present in the output data, the ECC circuit 15 outputs a check bit indicating it to the outside. That is, when an error of 2 or more bits is present in the output data, the ECC circuit 15 cannot correct the error.

In this embodiment, the ECC circuit 15 executes error correction for 2 bits read out simultaneously (1 bit read out from the memory cell array 11A and 1 bit read out from the memory cell array 11B, i.e., 2 bits in total).

Figure 2:
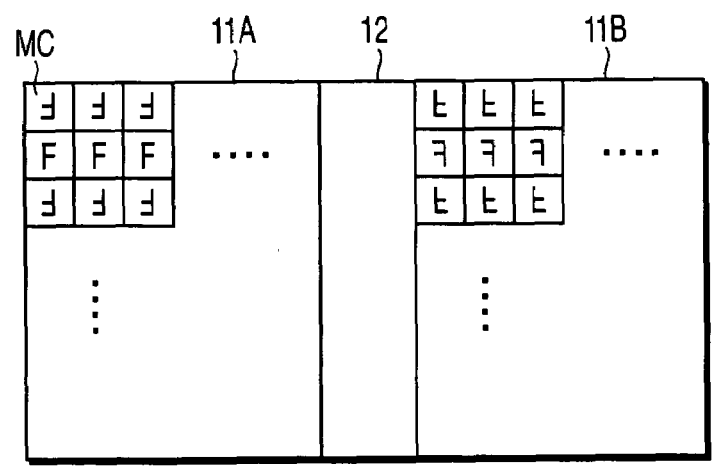
FIG. 2 is a schematic view showing the arrangements of memory cell arrays 11A and 11B shown in FIG. 1.

The arrangement of the memory cell array of this embodiment will be described next. In this embodiment, an SRAM will be described as an example. FIG. 2 is a schematic view showing the arrangements of the memory cell arrays 11A and 11B shown in FIG. 1.

The memory cell array 11A includes the plurality of memory cells MC arranged in a matrix. In the memory cell array 11A, the rows of memory cells having an upward layout and the rows of memory cells having a downward layout are alternately arranged. That is, the memory cells MC arranged in the same row have the layout in the same direction.

Memory cells included in two adjacent rows are line-symmetrical with respect to the boundary between the two rows. Referring to FIG. 2, the two directions of "F" indicate the upward (F) and downward layouts of the memory cells MC, respectively.

The memory cell arrays 11A and 11B are line-symmetrical with respect to the boundary (e.g., the column-direction center line of the row decoder 12) between them.

Figure 3:
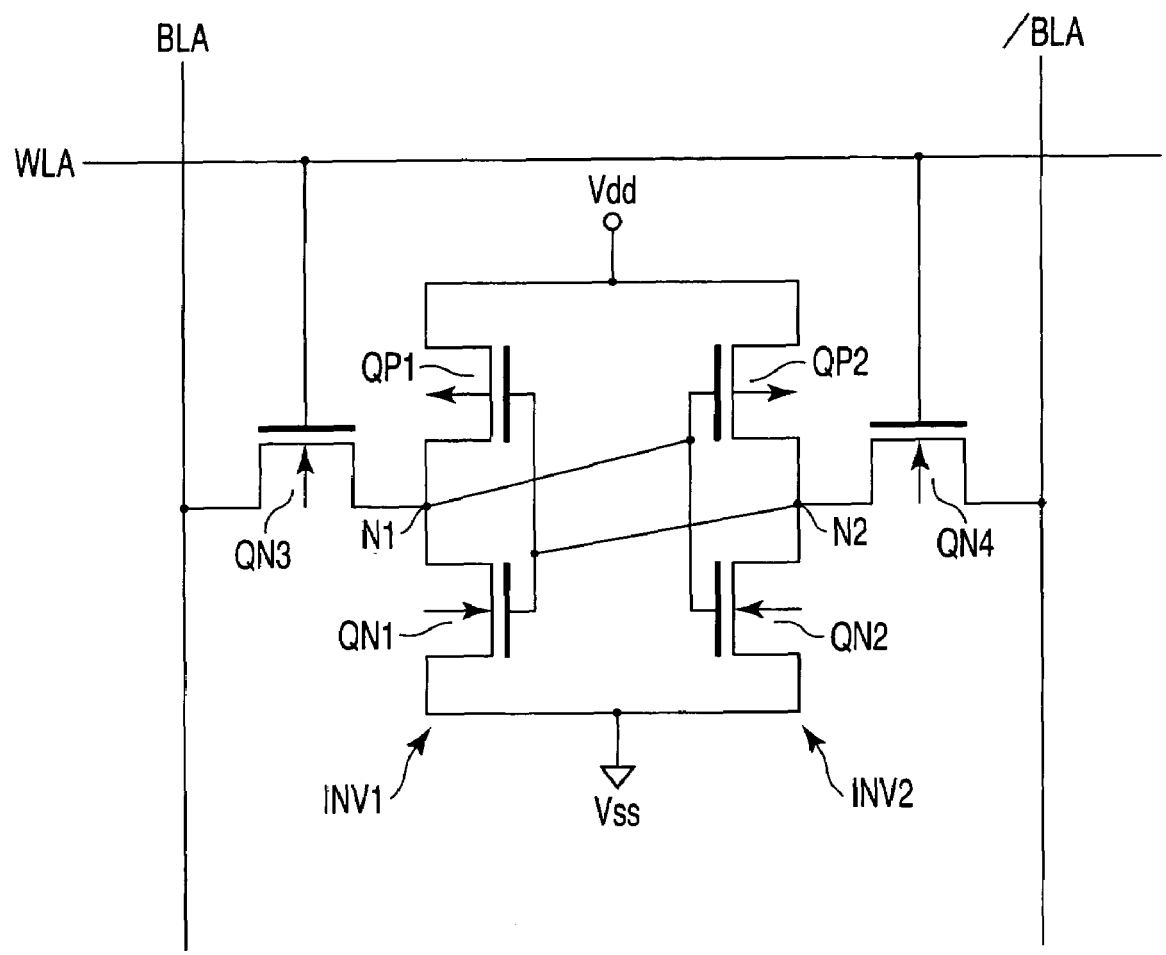
FIG. 3 is a circuit diagram of a memory cell MC shown in FIG. 2.

FIG. 3 is a circuit diagram of the memory cell MC shown in FIG. 2. The memory cell MC comprises two inverter circuits INV1 and INV2. The inverter circuit INV1 includes a load p-type metal oxide semiconductor (MOS) transistor QP1 and a driving NMOS transistor QN1. The PMOS transistor QP1 and NMOS transistor QN1 are connected in series between a power supply voltage Vdd and a ground voltage Vss.

The inverter circuit INV2 includes a load PMOS transistor QP2 and a driving NMOS transistor QN2. The PMOS transistor QP2 and NMOS transistor QN2 are connected in series between the power supply voltage Vdd and the ground voltage Vss.

More specifically, the source region of the PMOS transistor QP1 is connected to the power supply voltage Vdd. The drain region of the PMOS transistor QP1 is connected to the drain region of the NMOS transistor QN1 through a storage node N1. The source region of the NMOS transistor QN1 is connected to the ground voltage Vss. The gate electrode of the PMOS transistor QP1 is connected to the gate electrode of the NMOS transistor QN1.

The storage node N1 corresponds to the output portion of the inverter circuit INV1. The gate electrode of the PMOS transistor QP1 (or the gate electrode of the NMOS transistor QN1) corresponds to the input portion of the inverter circuit INV1.

The source region of the PMOS transistor QP2 is connected to the power supply voltage Vdd. The drain region of the PMOS transistor QP2 is connected to the drain region of the NMOS transistor QN2 through a storage node N2. The source region of the NMOS transistor QN2 is connected to the ground voltage Vss. The gate electrode of the PMOS transistor QP2 is connected to the gate electrode of the NMOS transistor QN2.

The storage node N2 corresponds to the output portion of the inverter circuit INV2. The gate electrode of the PMOS transistor QP2 (or the gate electrode of the NMOS transistor QN2) corresponds to the input portion of the inverter circuit INV2.

The output portion of the inverter circuit INV1 is connected to the input portion of the inverter circuit INV2. The output portion of the inverter circuit INV2 is connected to the input portion of the inverter circuit INV1.

The storage node N1 is connected to the bit line BLA through an NMOS transistor QN3 serving as a select transistor. More specifically, the source region of the NMOS transistor QN3 is connected to the storage node N1. The drain region of the NMOS transistor QN3 is connected to the bit line BLA. The gate electrode of the NMOS transistor QN3 is connected to the word line WLA.

The storage node N2 is connected to the bit line /BLA through an NMOS transistor QN4 serving as a select transistor. More specifically, the source region of the NMOS transistor QN4 is connected to the storage node N2. The drain region of the NMOS transistor QN4 is connected to the bit line /BLA. The gate electrode of the NMOS transistor QN4 is connected to the word line WLA.

The layout of the memory cells MC will be described next. FIG. 4 is a view showing the arrangement of nine memory cells MC included in the memory cell array 11A shown in FIG. 2. Each memory cell MC includes the PMOS transistors QP1 and QP2 and NMOS transistors QN1 to QN4.

These MOS transistors are formed by an active area (AA) (the channel portion and source and drain regions of the MOS transistor), gate electrode (GC), first layer metal interconnection (M1), contact plug (CS), and via plug (VP).

As described above, the rows of memory cells MC having the upward layout and the rows of memory cells MC having the downward layout are alternately arranged. The memory cells included in two adjacent rows are line-symmetrical with respect to the boundary between the two rows.

The layout of the transistors can arbitrarily be changed. Hence, which memory cells have the upward layout changes depending on the layout of the transistors. When an arbitrary memory cell MC has the upward layout, a memory cell MC having the downward layout indicators a memory cell whose active area (AA), gate electrode (GC), and the like are line-symmetrical to those of the memory cell MC having the upward layout with respect to the boundary between the rows.

The memory cell array 11A having this arrangement can reduce its area as compared to a memory cell array in which all memory cell MC are laid out in the same direction. In addition, the manufacturing process can be simplified.

In the semiconductor memory device of this embodiment, as shown in FIG. 1, the two adjacent word lines WLA0 and WLA1 cross at least once. More specifically, almost ½ of the memory cells MC of the first row and ½ of the memory cells MC of the second row are connected to the word line WLA0. In other words, the memory cells MC having the upward layout and those having the downward layout are connected to each word line.

In addition, the word line WLA and WLB cross such that the memory cells MC of the memory cell array 11A and those of the memory cell array 11B, which are selected simultaneously, have different layout directions.

Referring to FIG. 1, the memory cell MC selected by the word line WLA0 and bit line pair BLA0 and /BLA0 and the memory cell MC selected by the word line WLB0 and bit line pair BLB0 and /BLB0 have different layout directions.

In the manufacturing process, a difference in characteristic may be generated between the memory cells MC having the upward layout and the memory cells MC having the downward layout by the direction of ion implantation to form the diffusion layers of the transistors. As a result, a difference in fraction defective may be generated.

In this case, in the arrangement without crossing word lines, all the memory cells MC read-accessed simultaneously are directed upward or downward. Hence, if the fraction defective changes between the memory cells MC having the upward layout and those having the downward layout, the fraction defective of 2 or more bits becomes higher in one of the word (2 bits in this embodiment) formed by the memory cells having the upward layout and the word formed by the memory cells MC having the downward layout than in the other. This results in a decrease in relief rate in the whole memory.

In this embodiment, however, the adjacent word lines cross. For example, ½ of the memory cells MC read-accessed simultaneously are directed upward, and the remaining memory cells are directed downward. Hence, even when the fraction defective changes between the memory cells MC having the upward layout and those having the downward layout, the fraction defectives of 2 or more bits in word are averaged. As a result, the worst value of the fraction defective of 2 or more bits can be made smaller than in the conventional arrangement, and the relief rate in the whole memory can be increased.

In this embodiment, two word lines cross once. However, they may cross twice or more.

In this embodiment, two adjacent word lines cross. However, the present invention is not limited to this. More specifically, the effect of this embodiment can be obtained when a word line is connected to the memory cells MC having a characteristic difference such that the memory cells MC having a characteristic difference are read-accessed simultaneously.

(Second Embodiment)

In the second embodiment, the progress of the row address signal is changed between a memory cell array 21A and a memory cell array 21B.

Figure 5:
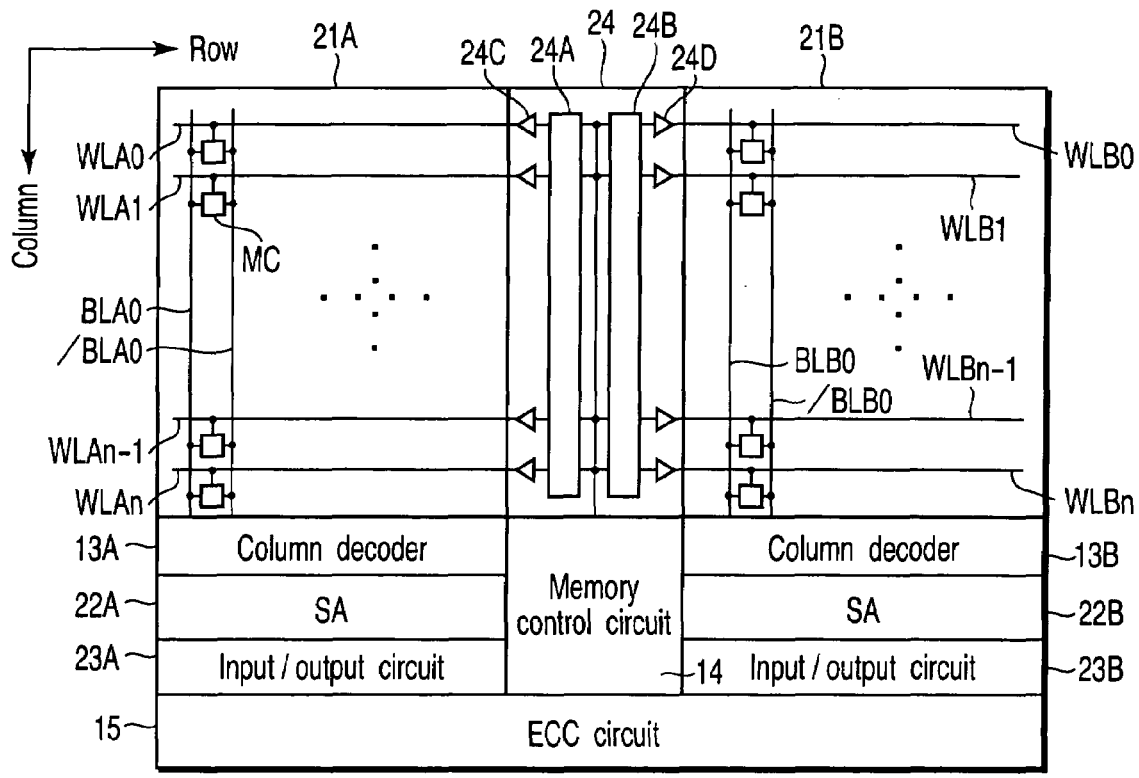
FIG. 5 is a block diagram showing the arrangement of a semiconductor memory device according to the second embodiment of the present invention.

FIG. 5 is a block diagram showing the arrangement of a semiconductor memory device according to the second embodiment of the present invention. Each of the memory cell arrays 21A and 21B includes a plurality of memory cells MC arranged in a matrix.

A row decoder 24 is arranged between the memory cell array 21A and the memory cell array 21B. The row decoder 24 is connected to word lines WLA and WLB and selects the rows of the memory cell arrays 21A and 21B.

The row decoder 24 comprises a plurality of output circuits 24C and 24D corresponding to the plurality of word lines. The output circuit 24C is connected to the word line WLA. The output circuit 24D is connected to the word line WLB.

A sense amplifier circuit (SA) 22A is arranged adjacent to a column decoder 13A. Data read out from the memory cell MC through the column decoders 13A is detected and amplified by the sense amplified circuit 22A and output from an input/output circuit 23A.

A sense amplifier circuit 22B is arranged adjacent to a column decoder 13B. Data read out from the memory cell MC through the column decoders 13B is detected and amplified by the sense amplifier circuit 22B and output from an input/output circuit 23B.

The output data output from the input/output circuits 23A and 23B are error-corrected by an ECC circuit 15.

A memory control circuit 14 controls the row decoder 24, column decoders 13A and 13B, sense amplified circuits 22A and 22B, and input/output circuits 23A and 23B. The memory control circuit 14 comprises an address decoder 14A to be described later. The address decoder 14A decodes an externally input row address signal.

The row decoder 24 comprises a decoder circuit 24A which selects the row of the memory cell array 21A and a decoder circuit 24B which selects the row of the memory cell array 21B.

The decoder circuit 24A activates word lines WLA0 to WLAn corresponding to externally input row address signals. More specifically, the decoder circuit 24A sequentially activates the word lines WLA0 to WLAn in accordance with the progress order of the row address signal.

The decoder circuit 24B activates word lines WLB0 to WLBn in a direction reverse to the externally input row address signals. More specifically, the decode circuit 24B sequentially activates the word lines WLBn to WLB0 in accordance with the progress order of the row address signal.

Figure 6:
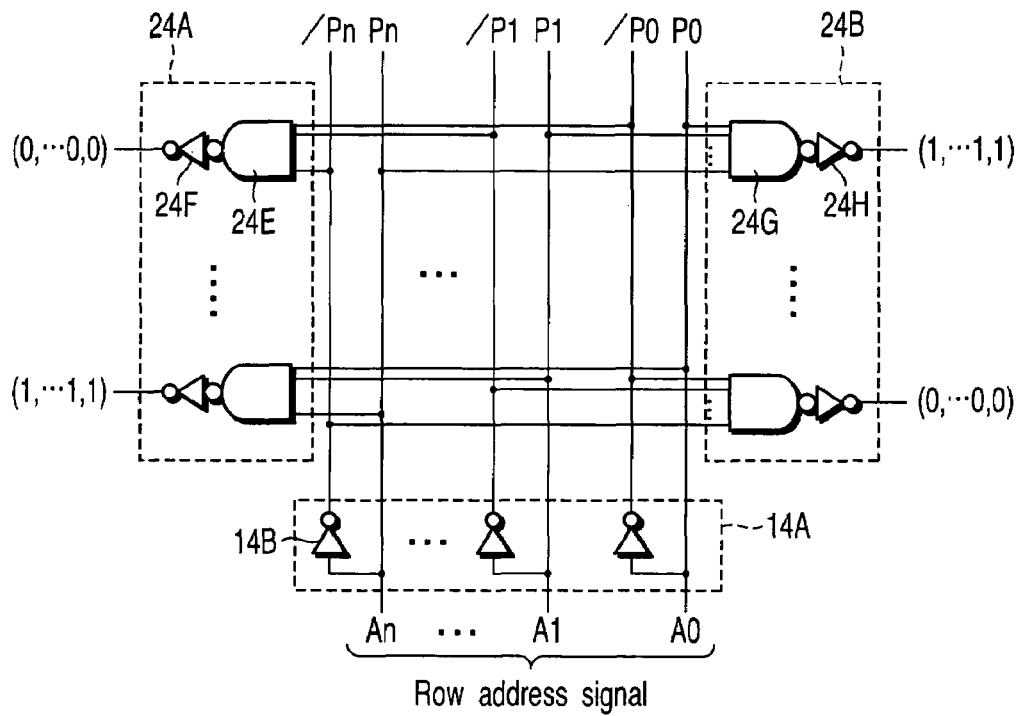
FIG. 6 is a circuit diagram showing an example of the arrangement of a row decoder 24 shown in FIG. 5.

An example of the arrangement of the row decoder 24 will be described below. FIG. 6 is a circuit diagram showing an example of the arrangement of the row decoder 24 shown in FIG. 5.

An externally input row address signal is decoded by the address decoder 14A included in the memory control circuit 14. The address decoder 14A comprises a plurality of inverter circuits 14B corresponding to the number of row address signal bits (An to A1, A0). For example, on the basis of the row address signal A0, the address decoder 14A generates a decoder signal P0 which is the same as the row address signal A0 and a decode signal /P0 obtained by inverting the row address signal A0.

The decoder circuit 24A comprises a plurality of NAND circuits 24E corresponding to the word lines WLA0 to WLAn, and a plurality of inverter circuits 24F connected to the output terminals of the NAND circuits 24E. The inverter circuit 24F is connected to the output circuit 24C.

The NAND circuits 24E are connected to decode signal lines P and /P such that the word lines WLA0 to WLAn are sequentially activated in accordance with the progress of the row address signal.

The decode circuit 24B comprises a plurality of NAND circuits 24G corresponding to the word lines WLB0 to WLBn, and a plurality of inverter circuits 24H connected to the output terminal of the NAND circuits 24G. The inverter circuit 24H is connected to the output circuit 24D.

The NAND circuits 24G are connected to the decode signal lines P and /P such that the word lines WLBn to WLB0 are sequentially activated in accordance with the progress order of the row address signal.

As shown in FIG. 5, each memory cell MC is connected to a bit line. Each memory cell is selected by the column decoder and then read-accessed by the sense amplifier circuit. At this time, the sense amplifier circuit amplifies a very small potential difference. Hence, the operation margin is strict.

Along with the scaling of the semiconductor memory device, the interconnection pitch between the bit lines also decreases. Hence, the RC delay generated by an interconnection resistance (R) and interconnection capacitance (C) increases. The influence of the bit line delay changes depending on the distance from the sense amplifier circuit. The longer the distance from the sense amplifier circuit to the memory cell MC becomes, the larger the influence of the RC delay on the memory cell MC becomes. Hence, the operation margin is strict.

For this reason, the fraction defective changes depending on the distance from the sense amplifier circuit, and the fraction defective of memory cells MC far from the sense amplifier circuit increases. In the conventional arrangement in which the row address signal progresses in the same way in the memory cell arrays 21A and 21B, for example, memory cells farthest from the sense amplifier circuit are read-accessed as the same word. Hence, the fraction defective of 2 or more bits considerably increases in this word.

In this embodiment, however, the row address signal progresses in reverse directions in the memory cell arrays 21A and 21B. With this arrangement, ½ of the memory cells MC which are read-accessed simultaneously are far from the sense amplifier circuit, and the remaining memory cells are close to the sense amplifier circuit.

Hence, even when the fraction defective changes depending on the distance from the sense amplifier circuit, the fraction defectives of 2 or more bits in the words are averaged. As a result, the worst value of the fraction defective of 2 or more bits can be made lower than in the conventional arrangement, and the relief rate in the whole memory can be increased.

In this embodiment, the direction of progress of the row address signal is completely reversed between in the memory cell array 21A and the memory cell array 21B. However, the present invention is not limited to this. The fraction defective can be reduced unless the memory cells far from the sense amplifier circuit are simultaneously read-accessed.

For example, the row address signal may be progressed in a direction from the word line arranged at the intermediate point of the memory cell array 21B to the sense amplifier circuit. After reaching the word line WLBn, the row address signal may be progressed from the word line WLB0 farthest from the sense amplifier circuit to the word line at the intermediate point.

This arrangement can easily be implemented by changing the connection between the NAND circuits 24G included in the decode circuit 24B and the decode signal lines.

(Third Embodiment)

In the third embodiment, the progress of the column address signal is changed between a memory cell array 21A and a memory cell array 21B.

Figure 7:
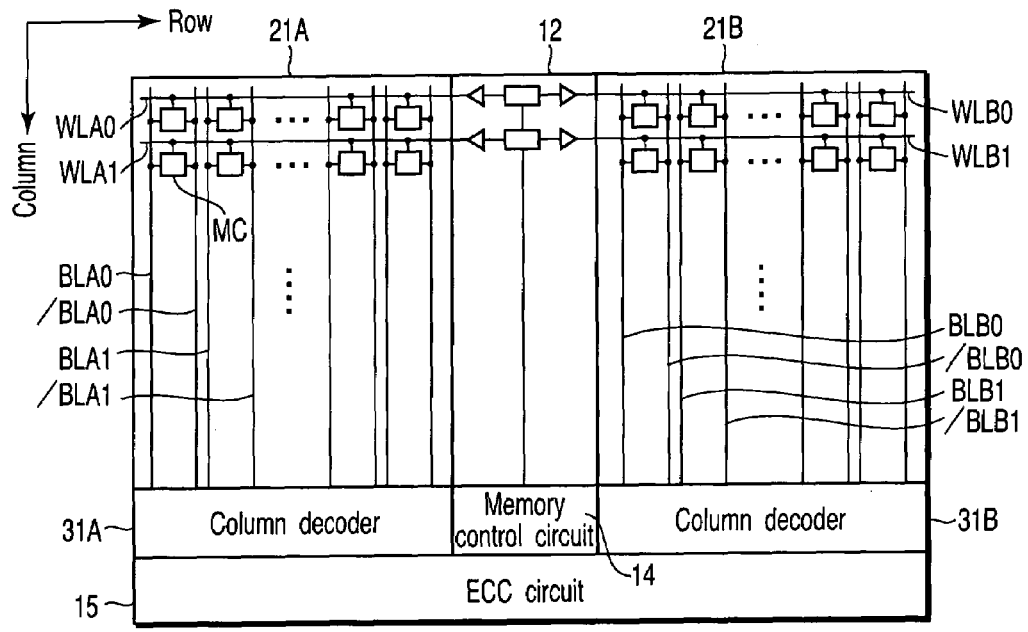
FIG. 7 is a block diagram showing the arrangement of a semiconductor memory device according to the third embodiment of the present invention.

FIG. 7 is a block diagram showing the arrangement of a semiconductor memory device according to the third embodiment of the present invention. Each of the memory cell arrays 21A and 21B includes a plurality of memory cells MC arranged in a matrix.

A row decoder 12 is arranged between the memory cell array 21A and the memory cell array 21B. The row decoder 12 is connected to word lines WLA and WLB and selects the rows of the memory cell arrays 21A and 21B.

A column decoder 31A is arranged at the column-direction end of the memory cell array 21A. The column decoder 31A is connected to a plurality of bit line pairs BLA0 to BLAm and /BLA0 to /BLAm. The column decoder 31A selects a column of the memory cell array 21A on the basis of a column address signal.

A column decoder 31B is arranged at the column-direction end of the memory cell array 21B. The column decoder 31B is connected to a plurality of bit line pairs BLB0 to BLBm and /BLB0 to /BLBm. The column decoder 31B selects a column of the memory cell array 21B on the basis of a column address signal.

Data read out from the memory cells MC through the column decoders 31A and 31B are detected and amplified by a sense amplifier circuit (not shown) and output from an input/output circuit (not shown).

The semiconductor memory device comprises a memory control circuit 14. The memory control circuit 14 controls the row decoder 12 and column decoders 31A and 31B. The memory control circuit 14 comprises an address decoder 14C to be described later. The address decoder 14C decodes an externally input column address signal.

The column decoder 31A selects a bit line pair BLA and /BLA corresponding to the externally input column address signal. More specifically, the column decoder 31A sequentially selects the bit line pairs BLA0 and /BLA0 to BLAm and /BLAm in accordance with the progress order of the column address signal.

The column decoder 31B interchanges an even column and odd column and selects bit line pair BLB and /BLB in correspondence with the externally input column address signal. More specifically, when a column address signal (0, . . . , 0, 0) is input, the column decoder 31B selects a bit line pair BLB1 and /BLB1. When a column address signal (0, . . . , 0, 1) is input, the column decoder 31B selects a bit line pairs BLB0 and /BLB0.

Figure 8:
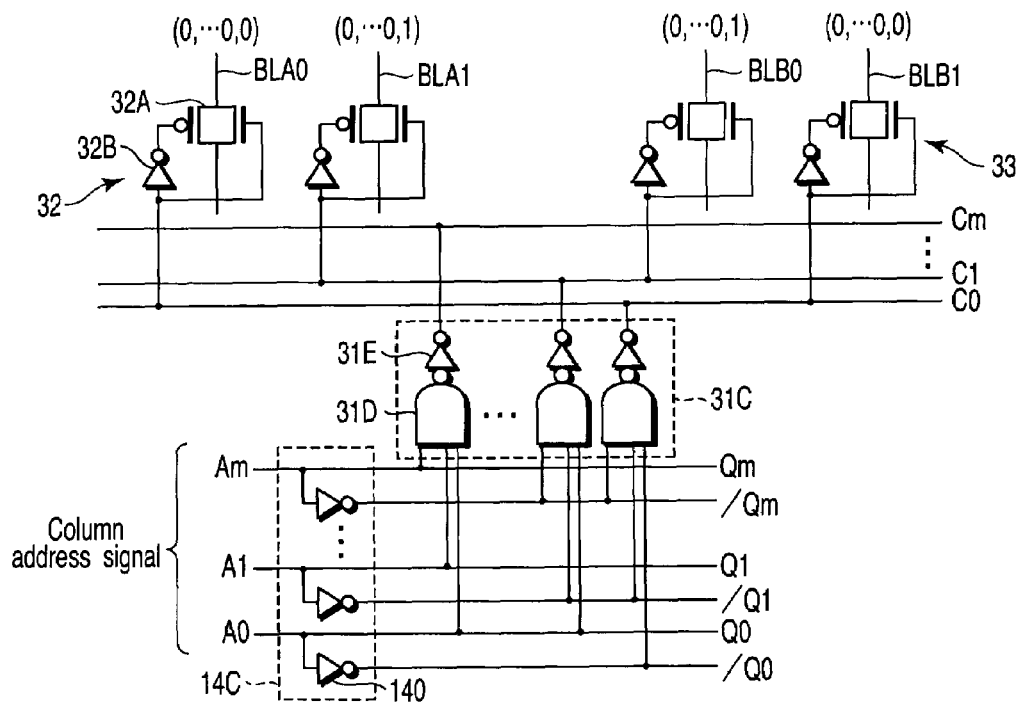
FIG. 8 is a circuit diagram showing an example of the arrangement of column decoders 31A and 31B shown in FIG. 7.

An example of the arrangement of column decoders 31A and 31B will be described below. FIG. 8 is a circuit diagram showing an example of the arrangement of the column decoders 31A and 31B shown in FIG. 7.

An externally input column address signal is decoded by the address decoder 14C included in the memory control circuit 14. The address decoder 14C comprises a plurality of inverter circuits 14D corresponding to the number of bits of the column address signal (Am, . . . , A1, A0). For example, on the basis of a column address signal A0, the address decoder 14C generates a decoder signal Q0 which is the same as the column address signal A0 and a decode signal /Q0 obtained by inverting column address signal A0.

A decoder circuit 31C included in the column decoder comprises a plurality of NAND circuits 31D corresponding to column select lines C0 to Cm, and a plurality of inverter circuits 31E connected to the output terminals of the NAND circuits 31D. The plurality of inverter circuits 31E are connected to the column select lines C0 to Cm. The decode circuit 31C activates the column select lines C0 to Cm on the basis of the column address signal.

The column decoder 31A comprises a plurality of column gates 32 corresponding to the plurality of bit line pairs BLA and /BLA. The column gate 32 is formed by using, e.g., a pass transistor 32A. More specifically, the column gate 32 is designed to control switching of the ON/OFF state of the pass transistor 32A in accordance with the column address signal supplied through the column select line and the inverted signal of the column address signal, which is supplied through an inverter circuit 32B. The column gate 32 is connected to an input/output circuit (not shown).

The column decoder 31B comprises a plurality of column gates 33 corresponding to the plurality of bit line pairs BLB and /BLB. The arrangement of the column gate 33 is the same as that of the column gate 32.

Two column gates 33 including adjacent even and odd columns are connected while interchanging the column select lines. Referring to FIG. 8, the column gate connected to the bit line /BLA is not illustrated because it has the same arrangement as that of the column gate connected to the bit line BLA. This also applies to the bit line /BLB.

At the memory cell array end, the periodicity of the layout is not maintained. Hence, the fraction defective of the memory cells MC laid out at the memory cell array end becomes higher as compared to the memory cells MC laid out inside the memory cell array. In the conventional structure, since columns arranged at the memory cell array ends are selected simultaneously, the fraction defective of the memory cells MC increases.

In the semiconductor memory device of this embodiment, however, the even and odd columns of the memory cell array 21B are interchanged and selected.

Hence, concentration of columns located at the memory cell array ends on one word can be prevented. As a result, the worst value of the fraction defective of 2 or more bits can be made smaller than in the conventional arrangement, and the relief rate in the whole memory can be increased.

Unless the memory cell MC located at the end of the memory cell array 21A and the memory cell MC located at the end of the memory cell array 21B are simultaneously read-accessed, the fraction defective can be reduced.

Hence, when the memory cell MC located at the end of the memory cell array 21A is read-accessed, the memory cell MC inside the memory cell array 21B is read-accessed. With this arrangement, the same effect as that of this embodiment can be obtained.

For example, the column address signal is made to progress from the intermediate column of the memory cell array 21B. After reaching the final column (bit line pair BLBm and /BLBm), the column address signal is made to progress from the first column (bit line pair BLB0 and /BLB0) to the intermediate column of the memory cell array 21B.

This arrangement can easily be implemented by changing connection between the column gate 33 and the column select line.

This embodiment can also be applied to memory cells adjacent to a shunt region which is arranged in the memory cell array and in which the periodicity of the layout is not maintained. For example, in the semiconductor memory device, to supply a stable well potential, a p- or n-type well formed in the substrate is divided into several parts, and the well potential is supplied from the potential supply source to each well.

Figure 9:
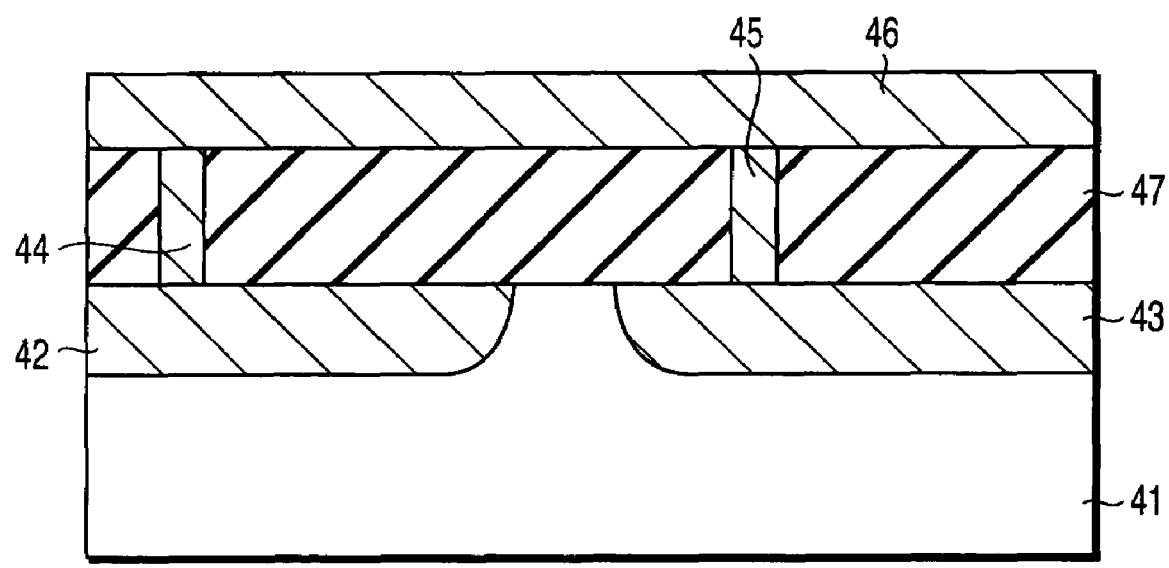
FIG. 9 is a sectional view showing an example of a shunt region.

FIG. 9 is a sectional view showing an example of a shunt region. P-type wells 42 and 43 in which a p-type impurity is implanted at a low concentration are formed in a substrate 41 on which a semiconductor memory device is to be formed. An insulating layer 47 is formed on the substrate 41, and a metal interconnection 46 to supply a well potential is formed on the insulating layer 47.

The p-type well 42 and metal interconnection 46 are connected through a contact plug 44. The p-type well 43 and metal interconnection 46 are connected through a contact plug 45. A transistor and the like are formed in the p-type wells 42 and 43. When the p-type wells are formed in this way, a stable well potential can be supplied to the p-type wells.

In this semiconductor memory device, the periodicity of the layout of the memory cell array is not maintained in the region where the well is divided. Hence, the fraction defective of the memory cells adjacent to the shunt region is high.

However, the fraction defective can be reduced by preventing read-access to the memory cells adjacent to the shunt region where the periodicity of the layout of the memory cell array is not maintained.

In the above-described embodiments, an SRAM has been described as the semiconductor memory device. However, the present invention is not limited to this. The present invention can also be applied to any other memory such as dynamic random access memory (DRAM).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell array which includes a first group of rows and a second group of rows, each row of the first group consisting of a plurality of first memory cells whose layout direction is a first direction, and each row of the second group consisting of a plurality of second memory cells whose layout direction is different from the first direction;
   a plurality of word lines which select rows of the memory cell array and each of which is connected to the first memory cells and second memory cells; and
   a plurality of bit line pairs which select columns of the memory cell array.

2. The device according to claim 1, wherein the rows of the first group and the rows of the second group are alternately arranged.

3. The device according to claim 2, wherein each word line crosses an adjacent word line at least once.

4. The device according to claim 2, wherein the row of the first group and the row of the second group which are adjacent to each other are laid out line-symmetrically with respect to a boundary between the row of the first group and the row of the second group.

5. The device according to claim 1, wherein
   the plurality of bit line pairs select at least two columns simultaneously; and
   memory cells selected simultaneously have different layout directions.

6. The device according to claim 5, further comprising a column selection circuit which is connected to the plurality of bit line pairs and selects at least two of the plurality of bit line pairs simultaneously.

7. The device according to claim 1, further comprising a row selection circuit which activates a corresponding one of the word lines.

8. The device according to claim 1, further comprising a correction circuit which corrects an error of data stored in the first memory cells and second memory cells.

9. A semiconductor memory device comprising:
   a first memory cell array and a second memory cell array each of which has a plurality of memory cells arranged in a matrix;
   a plurality of first word lines each of which selects a row of the first memory cell array;
   a first row selection circuit which activates a corresponding one of the first word lines on the basis of a row address signal;
   a plurality of second word lines each of which selects a row of the second memory cell array;
   a second row selection circuit which activates a corresponding one of the second word lines on the basis of the row address signal;
   a plurality of first bit line pairs each of which selects a column of the first memory cell array;
   a plurality of second bit line pairs each of which selects a column of the second memory cell array;
   a first sense amplifier circuit which amplifies data transferred to the plurality of first bit line pairs; and
   a second sense amplifier circuit which amplifies data transferred to the plurality of second bit line pairs,
   wherein a distance between the second sense amplifier circuit and a second word line activated by the second row selection circuit is different from a distance between the first sense amplifier circuit and a first word line activated by the first row selection circuit.

10. The device according to claim 9, wherein the second row selection circuit activates the second word line located at a position opposite to the activated first word line.

11. The device according to claim 10, wherein
   the first row selection circuit activates the plurality of first word lines in a second direction in accordance with progress of the row address signal, and
   the second row selection circuit activates the plurality of second word lines in a direction reverse to the second direction in accordance with progress of the row address signal.

12. The device according to claim 9, wherein the first word lines and second word lines are activated simultaneously.

13. The device according to claim 9, further comprising
   a first column selection circuit which selects the plurality of first bit line pairs on the basis of a column address signal; and a second column selection circuit which selects the plurality of second bit line pairs on the basis of the column address signal.

14. The device according to claim 9, further comprising a correction circuit which corrects an error of data stored in the plurality of memory cells of the first memory cell array and the plurality of memory cells of the second memory cell array.

15. A semiconductor memory device comprising:
a first memory cell array and a second memory cell array each of which has a plurality of memory cells arranged in a matrix;
a plurality of first word lines each of which selects a row of the first memory cell array;
a plurality of second word lines each of which selects a row of the second memory cell array;
a plurality of first bit line pairs each of which selects a column of the first memory cell array;
a first column selection circuit which selects a corresponding one of the first bit line pairs on the basis of a column address signal;
a plurality of second bit line pairs each of which selects a column of the second memory cell array; and
a second column selection circuit which selects a corresponding one of the second bit line pairs on the basis of the column address signal,
wherein when a column at an end of the first memory cell array is selected by the first column selection circuit, the second column selection circuit selects a column different from a column at an end of the second memory cell array.

16. The device according to claim 15, wherein
the first column selection circuit sequentially selects the plurality of first bit line pairs in accordance with progress of the column address signal; and
the second column selection circuit selects the second bit line pairs while interchanging even second bit line pairs and odd second bit line pairs.

17. The device according to claim 15, wherein the first bit line pairs and second bit line pairs are selected simultaneously.

18. The device according to claim 15, further comprising
a first row selection circuit which activates a corresponding one of the first word lines on the basis of a row address signal; and
a second row selection circuit which activates a corresponding one of the second word lines on the basis of the row address signal.

19. The device according to claim 15, further comprising a correction circuit which corrects an error of data stored in the plurality of memory cells of the first memory cell array and the plurality of memory cells of the second memory cell array.

* * * * *